United States Patent [19]

Komatsu

[11] 4,272,304
[45] Jun. 9, 1981

[54] METHOD OF MANUFACTURING A SEMICONDUCTOR DEVICE

[75] Inventor: Shigeru Komatsu, Yokohama, Japan

[73] Assignee: Tokyo Shibaura Denki Kabushiki Kaisha, Japan

[21] Appl. No.: 87,435

[22] Filed: Oct. 22, 1979

[30] Foreign Application Priority Data

Oct. 26, 1978 [JP] Japan .................................. 53-131876

[51] Int. Cl.³ .............................................. H01L 21/26
[52] U.S. Cl. ................................... 148/1.5; 148/187; 148/188
[58] Field of Search ........................ 148/187, 1.5, 188

[56] References Cited

U.S. PATENT DOCUMENTS

| | | | |
|---|---|---|---|
| 3,755,014 | 8/1973 | Appels et al. ................... | 148/188 X |
| 3,986,896 | 10/1976 | Veno et al. .................... | 148/188 X |
| 4,110,125 | 8/1978 | Beyer .......................... | 148/187 X |

Primary Examiner—G. Ozaki
Attorney, Agent, or Firm—Finnegan, Henderson, Farabow, Garrett & Dunner

[57] ABSTRACT

A method of manufacturing a semiconductor device by depositing a first insulation layer on a substrate in which a base region is formed, depositing a second insulation layer on said first insulation layer, and forming ports by the self-alignment process through which an emitter region and electrodes are deposited, said method further comprising the steps of depositing a covering layer on the second insulation layer, and selectively etching the other portions of the covering layer than that which covers a base electrode deposition preliminary port and thereafter forming the emitter region. The retained portion of the covering layer completely prevents an emitter diffusion impurity from being carried into a base electrode deposition port during the formation of an emitter region.

9 Claims, 24 Drawing Figures

F I G. 1
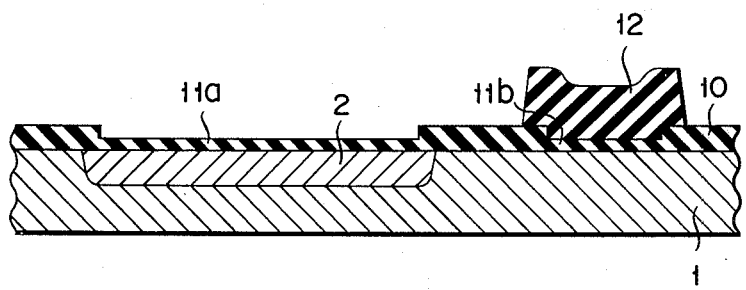
F I G. 2
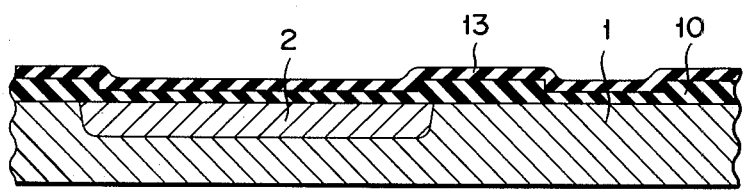
F I G. 3
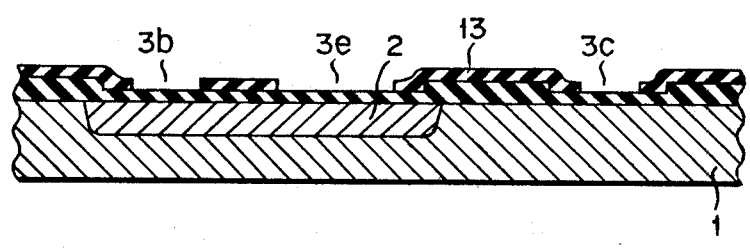

F I G. 13A
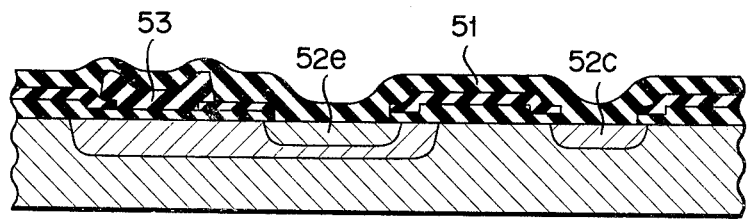
F I G. 13B
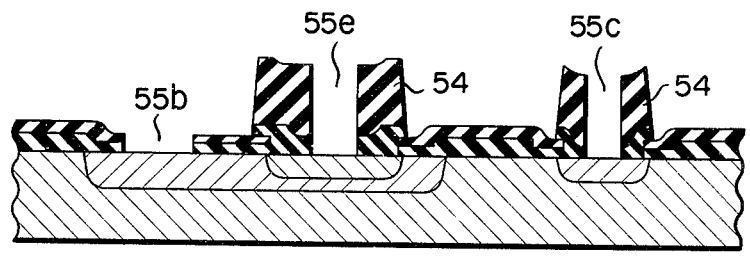
F I G. 13C
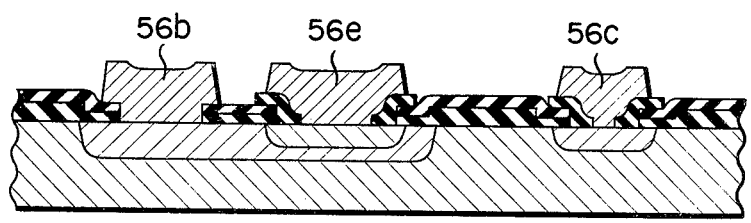

METHOD OF MANUFACTURING A SEMICONDUCTOR DEVICE

This invention relates to a method of manufacturing a transistor used as a semiconductor device and more particularly to a method of manufacturing a semiconductor device which prevents an emitter diffusion impurity from being undesirably carried into a semiconductor substrate through a base electrode leadout port.

A layer formed of silicon nitride, silicon carbide or metal oxide is widely used in the manufacture of a semiconductor device for the object of elevating the reliability of the semiconductor device and facilitating fine working required for integration. Where the layer is used as a self-alignment mask for formation of an emitter diffusion port or ports for leading out base and collector electrodes and is later retained as a passivation mask, then an insulation layer disposed below said passivation mask should be made as thin as possible. The reason for this is that if made thick, the insulation layer is excessively underetched below the passivation mask, thereby causing the passivation mask to present an overhanging form relative to the underetched insulation layer, and possibly giving rise to the cutting of wires in the subsequent fabrication of the base and collector electrodes. On the other hand, if the insulation layer is made considerably thin, then an emitter-forming impurity is carried into the base region from that portion of a thin insulation layer which is exposed at the bottom portion of the base electrode leadout port. As a result, said base region is undesirably rendered of the same conductivity type as the emitter region. With the self-alignment process of manufacturing a semiconductor device, the above-mentioned drawback makes it impossible to lead out an electrode from the base region.

It is accordingly the object of the invention to provide a self-alignment process of manufacturing a semiconductor device which prevents an emitter diffusion impurity from being carried into a substrate through a base electrode leadout port even when an insulation layer underlying said port is made considerably thin.

For the above-mentioned object, this invention provides a method of manufacturing a semiconductor device which comprises the steps of:

(1) forming a first insulation layer all over the main surface of a semiconductor substrate in which a base region is diffused, and covering the first insulation layer with a second insulation layer capable of selectively etching against the first insulation layer;

(2) selectively etching off the second insulation layer to form a preliminary port for the diffusion of an emitter region and a preliminary port for mounting a base electrode and collector electrode;

(3) depositing a covering layer capable of selectively etching against the second insulation layer all over the second insulation layer;

(4) selectively etching off the other portions of the covering layer than that which closes the preliminary port for mounting the base electrode to form a retained covering layer;

(5) selectively etching off those portions of the first insulation layer which are exposed at the bottoms of said emitter diffusion preliminary port and collector electrode deposition preliminary port in the second insulation layer, thereby providing an emitter diffusion port and collector electrode deposition port;

(6) forming an emitter region and a high concentration region for the leadout of a collector electrode through the emitter diffusion port and collector electrode deposition port, respectively; and (7) etching off that portion of the covering layer which is left on the base electrode deposition preliminary port (retained covering layer) and that portion of the first insulation layer which is exposed at the bottom of said port, thereby providing a base electrode deposition port.

In the preferred embodiment, the first insulation layer and retained covering layer are made of substantially the same material, for example silicon dioxide. Accordingly, the above-mentioned fourth and fifth steps can be taken at the same time.

Where an emitter region is formed by ion implantation, the covering layer may be prepared from a material having a blocking effect against ion implantation for example, a photoresist. Obviously in this case, the covering layer is not removed by an etchant, but by a solvent.

This invention can be more fully understood from the following detailed description when taken in conjunction with the accompanying drawings, in which:

FIGS. 1 to 10 are the schematic sectional views of a semiconductor device according to one embodiment of this invention, showing the sequential steps of manufacturing the same;

FIGS. 13A to 13C are the schematic sectional views of a semiconductor device according to a further embodiment of the invention, showing the sequential steps after the formation of an emitter region.

Figure 4:
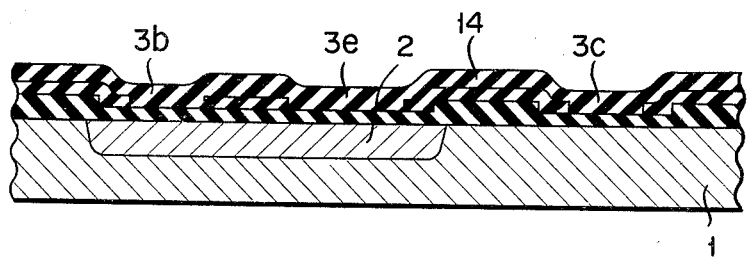

Referring to FIG. 1, a silicon oxide layer 10 is deposited with a thickness of 4000 to 5000 A all over the main surface of an n type silicon substrate 1 having a specific resistance of 1 to 2 Ω cm. A base region-forming port and collector electrode leadout port are simultaneously formed in the silicon oxide layer 10. Thereafter, thin insulation layers 11a, 11b for ion implantation are formed in an oxidizing atmosphere. A photoresist 12 is selectively mounted on the insulation layer 11b to prevent ions from being implanted in the collector region. Boron is diffused in the substrate 1 to form a base region 2 by ion implantation at a prescribed dose rate and acceleration voltage. Where the insulation layers 11a, 11b are formed with a thickness of about 1000 A, an acceleration voltage of 40 Kev and dose rate of about $4 \times 10^{14}$ atom/cm$^2$ provide a preferred result. The silicon oxide layer 10 and thin insulation layers 11a, 11b are collectively referred to as "a first insulation layer."

Referring to FIG. 2, a second insulation layer 13 is deposited by the customary process on the first insulation layer 10 with a thickness of about 1000 A. This second insulation layer 13 should preferably be formed of a material selected from the group consisting of silicon nitride, silicon carbide or metal oxide.

Referring to FIG. 3, the second insulation layer 13 of, for example, silicon nitride is selectively etched by plasma to provide an emitter diffusion preliminary port 3e, base electrode deposition preliminary port 3b and collector electrode deposition preliminary port 3c. The first insulation layer is exposed at the bottom of all these preliminary ports 3e, 3b, 3c.

Figure 5:
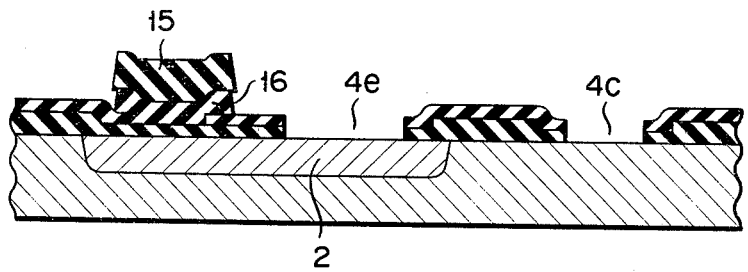

A covering layer 14 formed of a material capable of being selectively etched against the second insulation layer is deposited all over the second insulation layer by gas phase growth with a thickness of about 3000 A. For densification of the covering layer 14, it is possible to carry out heat treatment for about 10 to 30 minutes at a temperature of 900° to 1100° C. This heat treatment may be utilized to activate or diffuse the previously formed base region 2. For example, heat treatment conducted for 30 minutes at a temperature of 1100° C. controls the depth of the base region to about 1 micron. The covering layer 14 is selectively etched by means of a photoresist layer 15 to retain that portion 16 of the covering layer 14 which lies below there, as seen from FIG. 5. With the second insulation layer used as a mask, those portions of the first insulation layer which are exposed at the bottom of the emitter diffusion preliminary port 3e and collector electrode deposition preliminary port 3c are etched off to provide, as shown in FIG. 5, an emitter diffusion port 4e and collector electrode deposition port 4c. If the covering layer 14 and first insulation layer 10 are made of substantially the same material, for example, silicon oxide, it is preferred because the formation of the above-mentioned retained portion 16 of the covering layer 14, emitter diffusion port 4e and collector electrode deposition port 4c can be formed continuously by a single step.

Figure 6:
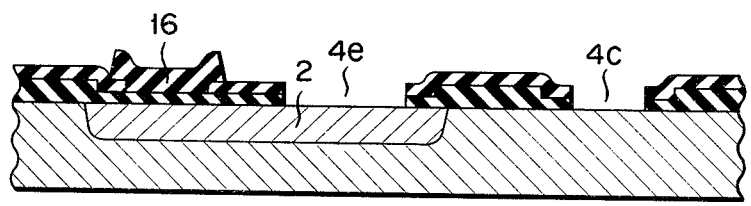
Figure 7:
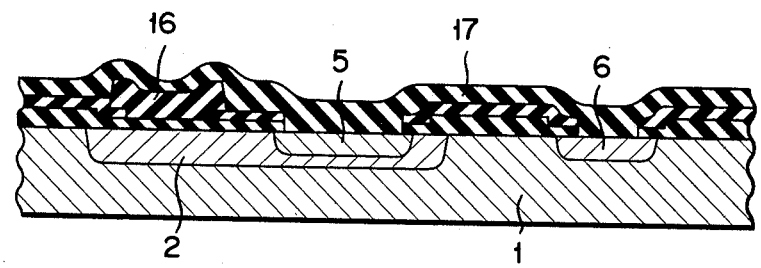

Referring to FIG. 6, the photoresist 15 is removed and then an emitter region is diffused by the customary process. As seen from FIG. 7, a silicon oxide layer 17 containing phosphorus or phosphorus and arsenic as an emitter diffusion impurity is deposited by gas phase growth with a thickness of about 5000 A at a temperature of 500° C., and then an emitter region 5 and collector electrode leadout high concentration region 6 are thermally formed. This heat treatment is carried out 30 minutes at a temperature of, for example, 1000° C. to control the rate of current amplification by a resultant transistor. The retained covering layer 16 completely prevents an emitter diffusion impurity from being undesirably carried into a semiconductor substrate 1 through the base electrode deposition preliminary port 3b.

Figure 8:
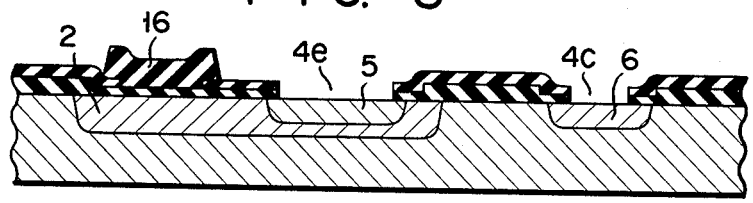
Figure 9:
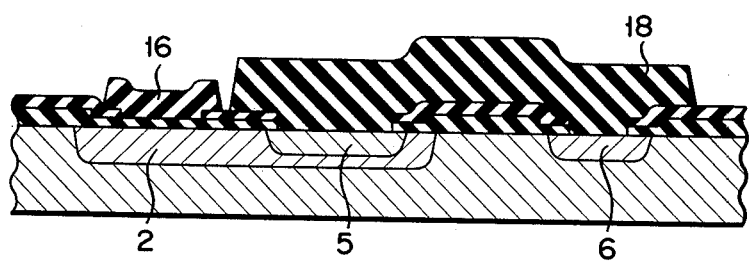

Referring to FIG. 8, the doped silicon oxide layer 17 is etched off by ammonium hydrofluoric or dilute fluoric acid. At this time, the retained covering layer 16 may also be etched off. However, it is possible, as shown in FIG. 9, to protect the emitter diffusion port 4e and collector electrode deposition port 4c with a photoresist 18, and then etch off the retained covering layer 16 and also the underlying first insulation layer to provide a base electrode deposition port. This process is intended to protect those portions of the substrate 1 which are exposed at the bottoms of the emitter diffusion port 4e and collector electrode deposition port 4c and also suppress the undesirable underetching of the first insulation layer.

Figure 10:
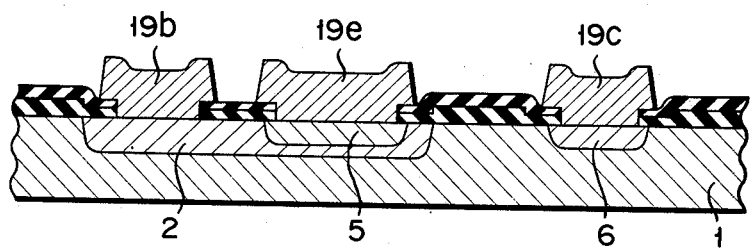

Last as seen from FIG. 10, an emitter electrode 19e, base electrode 19b and collector electrode 19c are formed by the customary process.

There will now be described by reference to FIGS. 11A to 11D the method of manufacturing a semiconductor device according to another embodiment of this invention.

Figure 11A:
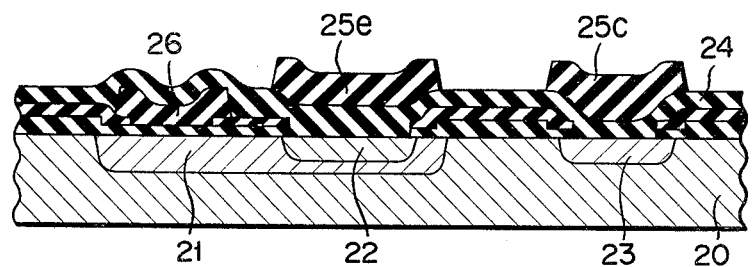
FIGS. 11A to 11D are the schematic sectional views of a semiconductor device according to another embodiment of the invention, showing the sequential steps after the formation of an emitter region.
Figure 11B:
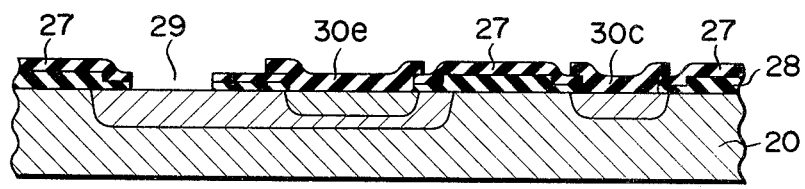

As in the steps of FIGS. 1 to 7, a base region 21, emitter region 22 and collector electrode leadout high concentration region 23 are formed in a substrate 20. Referring to FIG. 11A photoresist layers 25e, 25c are formed on a doped silicon oxide layer 24 to cover the emitter region 22 and collector electrode leadout high concentration region 23, respectively.

The doped silicon oxide layer 24 and the retained covering layer 26 are selectively etched off. With the exposed second insulation layer 27 used as a mask, the underlying first insulation layer 28 is etched to provide a base electrode deposition port 29. When the photoresist layers 25e, 25c are removed, protective insulation layers 30e, 30c are left, as seen from FIG. 11B, on the emitter region and collector electrode leadout high concentration region, respectively.

Figure 11C:
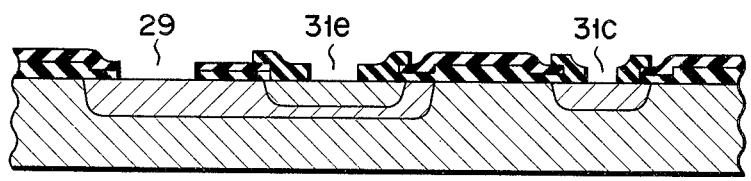
Figure 11D:
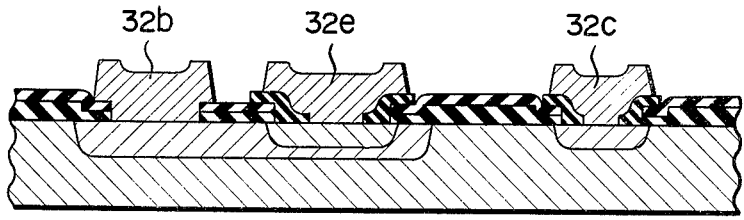

Referring to FIG. 11c, an emitter electrode deposition port 31e and collector electrode deposition port 31c are formed by the customary process on the protective insulation layers 30e, 30c respectively. Further, as shown in FIG. 11D, an emitter electrode 32e, base electrode 32b and collector electrode 32c are mounted over the emitter electrode deposition port 31e, base electrode deposition port 29 and collector electrode deposition port 31c respectively.

With the embodiment of FIGS. 11A to 11D, an insulation layer is formed with a fully great thickness on the emitter region, thereby preventing an electrode metal from being carried into a boundary between the substrate 20 and insulation layer 30e, and consequently suppressing short-circuiting between the base and emitter regions. This second embodiment makes it possible to use a resistor formed together with the emitter region as a reliable low resistance element.

Figure 12A:
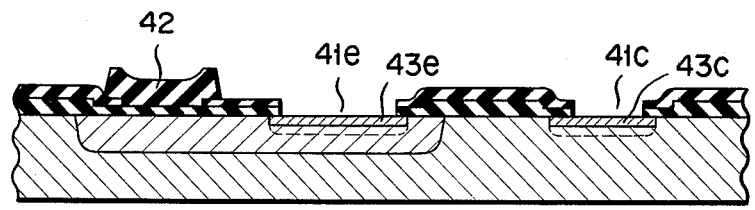
FIGS. 12A to 12D are the schematic sectional views of a semiconductor device according to still another embodiment of the invention, indicating the sequential steps after the formation of an emitter region.
Figure 12B:
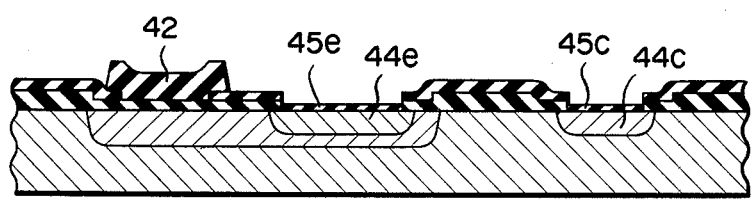
Figure 12C:
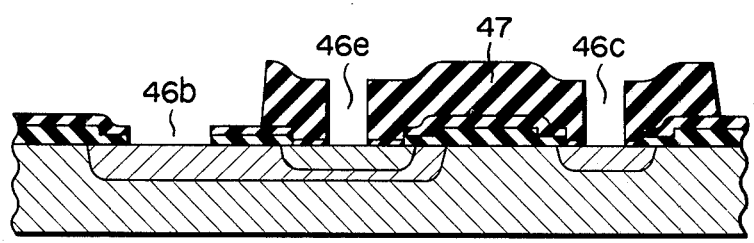
Figure 12D:
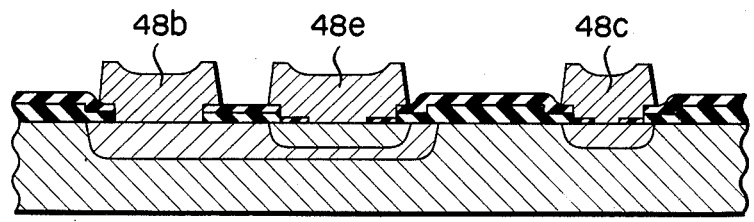

FIGS. 12A to 12D show the sequential steps of forming an emitter region by a gas phase-solid phase reaction, followed by slumping. The steps of FIGS. 1 to 6 used in the first embodiment are also applied in forming an emitter diffusion port 41e, collector electrode deposition port 41c and a retained covering layer 42 overlying the base electrode deposition preliminary port. Thereafter, impurity-containing layers 43e, 43c are formed in the substrate by a gas phase-solid phase reaction as shown in FIG. 12A. If, in case a base region is diffused with a depth of 1 micron, oxyphosphorus chloride is decomposed at a temperature of 950° C. in an oxidizing atmosphere, then a phosphorus-containing layer is formed which is required for the resultant transistor to indicate a desired rate of current application. Referring to FIG. 12B, the phosphorus included in said phosphorus-containing layer is diffused by steam oxidation at a temperature of 900° to 1000° C. to provide an emitter region 44e and collector electrode leadout high concentration region 44c and also silicon oxide layers 45e, 45c. The retained covering layer 42 is etched off through a patterned photoresist 47 to provide a base electrode deposition port 46b, emitter electrode deposition port 46e and collector electrode deposition port 46c (FIG. 12c). Last, an emitter electrode 48e, base electrode 48b and collector electrode 48c are formed (FIG. 12D).

FIGS. 13A to 13C show the sequential steps of manufacturing a semiconductor device according to a further embodiment of this invention in which it is necessary fully to enlarge the thickness of the insulation layer provided for the emitter region in the embodiment of FIGS. 12A to 12D. As in FIG. 12A, a phosphorus containing layer is formed by a gas phase-solid phase reaction. A fully thick silicon oxide layer 51 is deposited by gas phase growth all over the surface of the substrate. Thereafter, phosphorus is diffused by heat treatment to form an emitter region 52e, and collector electrode leadout high concentration region 52c (FIG. 13A). Referring to FIG. 13B, the silicon oxide layer 51, retaining covering layer 53 and previously defined first insulation layer are selectively etched off by applying a photoresist 54 to provide a base electrode deposition port 55b, emitter electrode deposition port 55e and collector electrode deposition port 55c. Last, as shown in FIG. 13c, an emitter electrode 56e, base electrode 56b and collector electrode 56c are formed after removal of the photoresist 54.

Figure 14A:
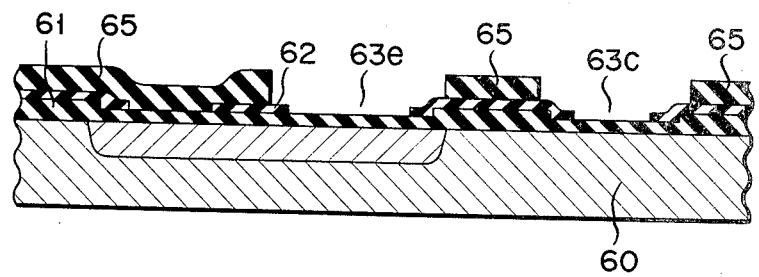
FIGS. 14A to 14C are the schematic sectional views of a semiconductor device according to a further embodiment of the invention.
Figure 14B:
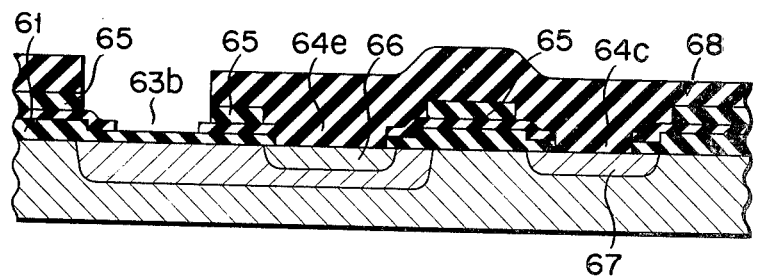
Figure 14C:
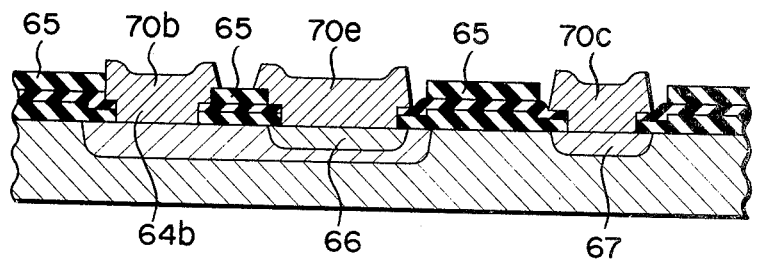

FIGS. 14A to 14C jointly represent another embodiment of this invention. This embodiment is adapted for the cases where the insulation layer 11a or insulation layer 11a and silicon oxide layer 10 used in FIG. 1 are made thin.

A photoresist is coated all over a semiconductor substrate 60 treated as illustrated in FIGS. 1 to 4. A covering layer 65 is selectively removed by photoetching to expose preliminary ports 63e, 63c (FIG. 14A). A first insulation layer 61 is selectively removed with a second insulation layer 62 used as a mask to provide a port 64e for the diffusion of an emitter region and a port 64c for depositing a collector electrode. Thereafter, an emitter region 66 and a highly concentrated region 67 for leading out a collector electrode are formed by any of the previously described processes. Only a retained covering layer disposed on a preliminary port 63b for the deposition of a base electrode is selectively removed by photoetching with a photoresist layer 68 shown in FIG. 14B used as a mask. The exposed portion of the first insulation layer 61 is removed to provide a port 64b for the deposition of a base electrode. Last, an emitter electrode 70e, base electrode 70b and collector electrode 70c are formed by the customary process (FIG. 14C). According to the embodiment of FIGS. 14A to 14C, a retained covering layer is left on the thin insulation layer, thereby providing a sufficiently thick layer to suppress the reversion of the conductivity type of a semiconductor region disposed below said insulation layer.

The above-described method of this invention completely suppresses the diffusion of an emitter impurity in the base electrode deposition port which has hitherto presented difficulties in manufacturing a semiconductor device by the self-align system, by retaining a covering layer on said base electrode deposition port, thereby enabling a semiconductor device to be manufactured with high precision and high yield.

It will be noted that this invention is not limited to the foregoing embodiments, but changes or modifications which may be easily undertaken by those skilled in the art are also included in the scope of the invention.

Throughout the foregoing embodiments, a base region was formed by ion implantation. However, it is possible to provide the base region by the customary process. The formation of an emitter region can be effected not only by the process described in the aforesaid embodiments, but also by any other customary process such as ion implantation, or thermal diffusion from doped polysilicon. Obviously, this invention can also be effectively utilized, where a semiconductor device is manufactured in which a transistor and other elements are included in the same semiconductor substrate.

What is claimed is:
1. A method of manufacturing a semiconductor device which comprises the steps of:
 (1) forming a first insulation layer all over the main surface of a semiconductor substrate in which a base region is diffused, and covering the first insulation layer with a second insulation layer capable of selectively etching against the first insulation layer;
 (2) selectively etching off the second insulation layer to form a preliminary port for the diffusion of an emitter region, a preliminary port for mounting a base electrode and a preliminary port for mounting a collector electrode;
 (3) depositing a covering layer capable of selectively etching against the second insulation layer all over the second insulation layer;
 (4) selectively etching off all portions of the covering layer except the portion which closes the preliminary port for mounting the base electrode to form a retained covering layer;
 (5) selectively etching off those portions of the first insulation layer which are exposed at the bottoms of said emitter diffusion and collector electrode preliminary ports, thereby providing an emitter diffusion port and collector electrode deposition port;
 (6) forming an emitter region and a high concentration region for the leadout of a collector electrode through the emitter diffusion port and collector electrode deposition port respectively; and
 (7) etching off the retained covering layer which is left on the base electrode deposition preliminary port and that portion of the first insulation layer which is exposed at the bottom of said base electrode deposition preliminary port, thereby providing a base electrode deposition port.

2. A method of manufacturing a semiconductor device which comprises the steps of:
 (1) forming a first insulation layer all over the main surface of a semiconductor substrate in which a base region is diffused, and covering the first insulation layer with a second insulation layer capable of selectively etching against the first insulation layer;
 (2) selectively etching off the second insulation layer to form a preliminary port for the diffusion of an emitter region, a preliminary port for mounting a base electrode and a preliminary port for mounting a collector electrode;
 (3) depositing a covering layer capable of selectively etching against the second insulation layer all over the second insulation layer;
 (4) selectively etching off the covering layer to expose the preliminary port for the diffusion of an emitter region and the preliminary port for mounting a collector electrode;
 (5) selectively etching off those portions of the first insulation layer which are exposed at the bottoms of said emitter diffusion and collector electrode preliminary ports, thereby providing an emitter diffusion port and collector electrode deposition port;

(6) forming an emitter region and a high concentration region for the leadout of a collector electrode through the emitter diffusion port and collector electrode deposition port respectively; and (7) selectively etching off only that portion of the retained covering layer which is left on the preliminary port for mounting a base electrode and etching off that portion of the first insulation layer which is exposed at the bottom of the preliminary port for mounting a base electrode to provide a base electrode deposition port.

3. The method according to claim 1 or 2, wherein the first insulation layer and the retained covering layer are made of substantially the same material and the steps of (4), (5) are carried out at the same time.

4. The method according to claim 3, wherein the first insulation layer and the retained covering layer are made of silicon dioxide.

5. The method according to claim 1 or 2, wherein the second insulation layer is made of a material selected from the group consisting of silicon nitride, silicon carbide and metal oxide.

6. The method according to claim 1 or 2, wherein the base electrode region is formed prior to formation of the emitter region when the emitter region is formed by ion implantation, and the retained covering layer is formed of a photoresist when the emitter region is formed by ion implantation.

7. The method according to claim 1 or 2, which comprises the steps of selectively etching the other portions of a silicon oxide layer deposited all over the surface of the substrate before or after the formation of an emitter region than those mounted on the emitter region and collector electrode leadout high concentration region to be used as protective insulation layers; and forming a base electrode deposition port, an emitter electrode deposition port, and collector electrode deposition port.

8. The method according to claim 1 or 2, which further comprises depositing a silicon oxide layer over the entire surface of the substrate after the formation of the emitter region, selectively etching all portions of the silicon oxide layer except the portions covering the emitter region and collector electrode leadout high concentration region to provide a protective insulation layer therefor, and then forming a base electrode deposition port, an emitter electrode deposition port, and a collector electrode deposition port.

9. The method according to claim 1 or 2, which further comprises depositing a silicon oxide layer over the entire surface of the substrate before the formation of an emitter region, selectively etching all portions of the silicon oxide layer except the portion covering the emitter region and collector electrode leadout high concentration region to provide a protective insulation layer therefor, and then forming a base electrode deposition port, an emitter electrode deposition port, and a collector electrode deposition port.

* * * * *